US012682944B2

(12) United States Patent
Harada et al.

(10) Patent No.: US 12,682,944 B2
(45) Date of Patent: Jul. 14, 2026

(54) METHOD FOR MANUFACTURING SEMICONDUCTOR-ELEMENT-CONTAINING MEMORY DEVICE

(71) Applicant: Unisantis Electronics Singapore Pte. Ltd., Singapore (SG)

(72) Inventors: Nozomu Harada, Tokyo (JP); Koji Sakui, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 439 days.

(21) Appl. No.: 18/537,121

(22) Filed: Dec. 12, 2023

(65) Prior Publication Data

US 2024/0194250 A1     Jun. 13, 2024

(30) Foreign Application Priority Data

Dec. 13, 2022     (WO) .................. PCT/JP2022/045900

(51) Int. Cl.
*H10B 12/00* (2023.01)
*G11C 5/06* (2006.01)
(Continued)

(52) U.S. Cl.
CPC .......... *G11C 11/4096* (2013.01); *G11C 5/063* (2013.01); *G11C 16/14* (2013.01); *G11C 16/26* (2013.01); *H10B 12/20* (2023.02)

(58) Field of Classification Search
CPC ........ H10B 43/27; H10B 20/40; H10B 41/27; H10B 12/20
See application file for complete search history.

(56) References Cited

U.S. PATENT DOCUMENTS

| | | |
|---|---|---|
| 2003/0111681 A1 | 6/2003 | Kawanaka |
| 2008/0137394 A1 | 6/2008 | Shimano et al. |
| | (Continued) | |

FOREIGN PATENT DOCUMENTS

| | | |
|---|---|---|
| JP | H02188966 A | 7/1990 |
| JP | H03171768 A | 7/1991 |
| | (Continued) | |

OTHER PUBLICATIONS

International Search Report and Written Opinion (in Japanese) in PCT/JP2022/045900, dated Mar. 14, 2023 (7 pages).

(Continued)

*Primary Examiner* — Evan G Clinton
(74) *Attorney, Agent, or Firm* — Crowell & Moring LLP

(57)     ABSTRACT

A two-stage dynamic flash memory is formed as follows. An N$^+$ layer 20 is formed in a pillar-shaped semiconductor layer 12, which stands on an N$^+$ layer 2a, by performing a heat treatment, thereby producing an effect of forcing a donor impurity out into the pillar-shaped semiconductor layer 12 from a silicide layer 18, which is a layer formed to surround a middle portion of the pillar-shaped semiconductor layer 12 and contains the donor impurity. Gate oxide layers 19a to 19d are formed on a side surface of the pillar-shaped semiconductor layer 12. Etching is performed with a single mask to form first to fourth gate conductor layers 21aa, 22aa, 22ba, and 21ba and a silicide layer 18a, which have the same shape as viewed in plan view. An N$^+$ layer 23 is formed on a top portion of the pillar-shaped semiconductor layer 12.

16 Claims, 14 Drawing Sheets

(51) Int. Cl.
| | |
|---|---|
| *G11C 11/4096* | (2006.01) |
| *G11C 16/14* | (2006.01) |
| *G11C 16/26* | (2006.01) |

(56) References Cited

U.S. PATENT DOCUMENTS

| | | | |
|---|---|---|---|
| 2017/0309632 A1 | 10/2017 | Masuoka et al. | |
| 2018/0033792 A1* | 2/2018 | Masuoka | H10B 10/12 |
| 2019/0109140 A1* | 4/2019 | Masuoka | H10D 64/01 |
| 2022/0208254 A1 | 6/2022 | Sakui et al. | |
| 2024/0098968 A1* | 3/2024 | Harada | H10B 12/20 |

FOREIGN PATENT DOCUMENTS

| | | | |
|---|---|---|---|
| JP | 2003188279 A | | 7/2003 |
| JP | 2008-147514 | | 6/2008 |
| JP | 7057032 B1 | | 4/2022 |
| WO | WO2016/162927 A | | 10/2016 |
| WO | WO2022/137607 A1 | | 6/2022 |

OTHER PUBLICATIONS

Takato, H., et al., "Impact of Surrounding Gate Transistor (SGT) for Ultra-High-Density LSI's", *IEEE Transactions on Electron Devices*, vol. 38, No. 3, Mar. 1991, pp. 573-578 (6 pages).

Chung, H., et al., "Novel $4F^2$ Dram Cell with Vertical Pillar Transistor(VPT)" *2011 Proceedings of the European Solid-State Device Research Conference* (2011) (4 pages).

Wong, H.S., P., et al., "Phase Change Memory" *Proceedings of the IEEE*, vol. 98, No. 12, Dec. 2010, pp. 2201-2227 (27 pages).

Tsunoda, K., et al., "Low Power and High Speed Switching of Ti-doped NiO ReRAM under the Unipolar Voltage Source of less than 3 V" IEDM (2007) pp. 767-770, (4 pages).

Kang, W., et al., "Reconfigurable Codesign of STT-MRAM Under Process Variations in Deeply Scaled Technology" *IEEE Transactions on Electron Devices*, vol. 62, No. 6, Jun. 2015, pp. 1769-1777 (9 pages).

Ertosun, M. G., et al., "Novel Capacitorless Single-Transistor Charge-Trap DRAM 1T CT DRAM) Utilizing Electrons" *IEEE Electron Device Letters*, vol. 31, No. 5, May 2010, pp. 405-407 (3 pages).

Wan, J., et al., "A Compact Capacitor-Less High-Speed DRAM Using Field Effect-Controlled Charge Regeneration" *IEEE Electron Device Letters*, vol. 33, No. 2, Feb. 2012, pp. 179-181 (3 pages).

Ohsawa, T., et al., "Memory Design Using a One-Transistor Gain Cell on SOI", *IEEE Journal of Solid-State Circuits*, vol. 37, No. 11, Nov. 2002 (13 pages).

Shino, T., et al., "Floating Body RAM Technology and its Scalability to 32nm Node and Beyond", IEEE IEDM (2006) (4 pages).

Yoshida, E., et al., "A Capacitorless 1T-DRAM Technology Using Gate-Induced Drain-Leakage (GIDL) Current for Low-Power and High-Speed Embedded Memory", *IEEE Trans. on Electron Devices*, vol. 53, No. 4, Apr. 2006, pp. 692-697 (6 pages).

Morishita, F., et al., "A Capacitorless Twin-Transistor Random Access Memory (TTRAM) on SOI"*IEICE Trans. Electron*, vol. E90-C, No. 4, Apr. 2007, pp. 765-771 (7 pages).

Sakui, K., et al., "Dynamic Flash Memory with Dual Gate Surrounding Gate Transistor (SGT) for Computation in Memory" *Proc. IEEE IMW*, pp. 127-128 (2021) (2 pages).

Goda, A., "Recent Progress on 3D NAND Flash Technologies", Journals, Electronics, vol. 10, Issue 24, https://doi.org/10.3390/electronics10243115b(2021) (16 pages).

English Translation of International Search Report and Written Opinion in PCT/JP2022/045900, dated Mar. 14, 2023 (5 pages).

\* cited by examiner

FIG. 1DA
FIG. 1DB
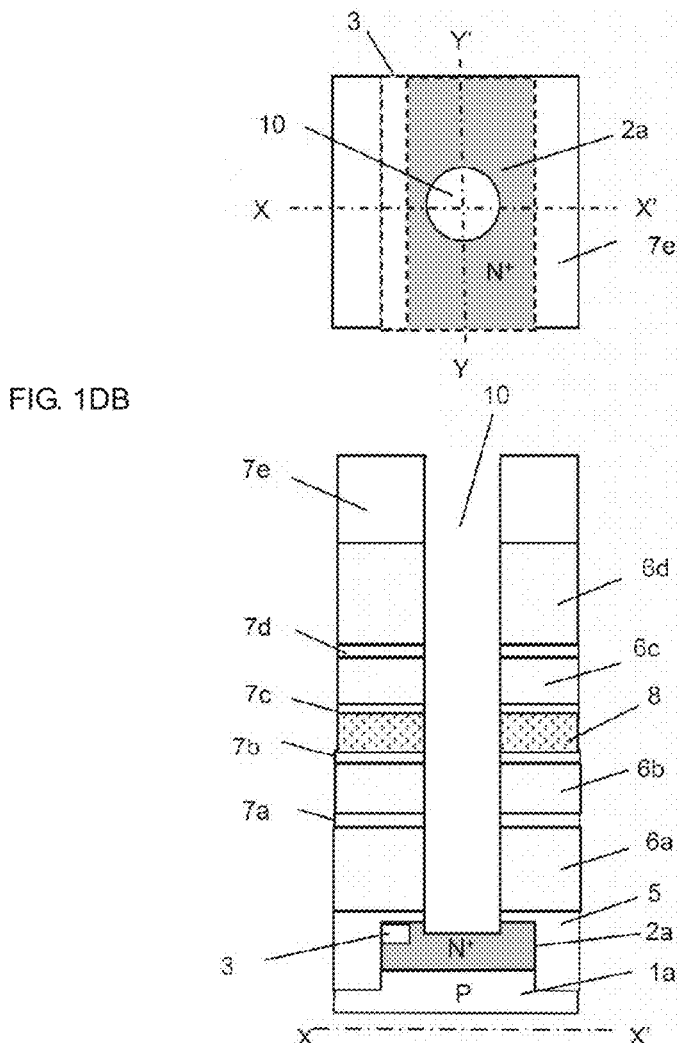
FIG. 1DC
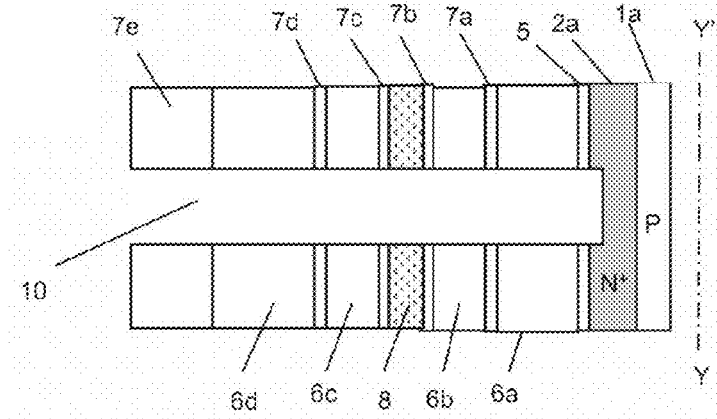

FIG. 1EA
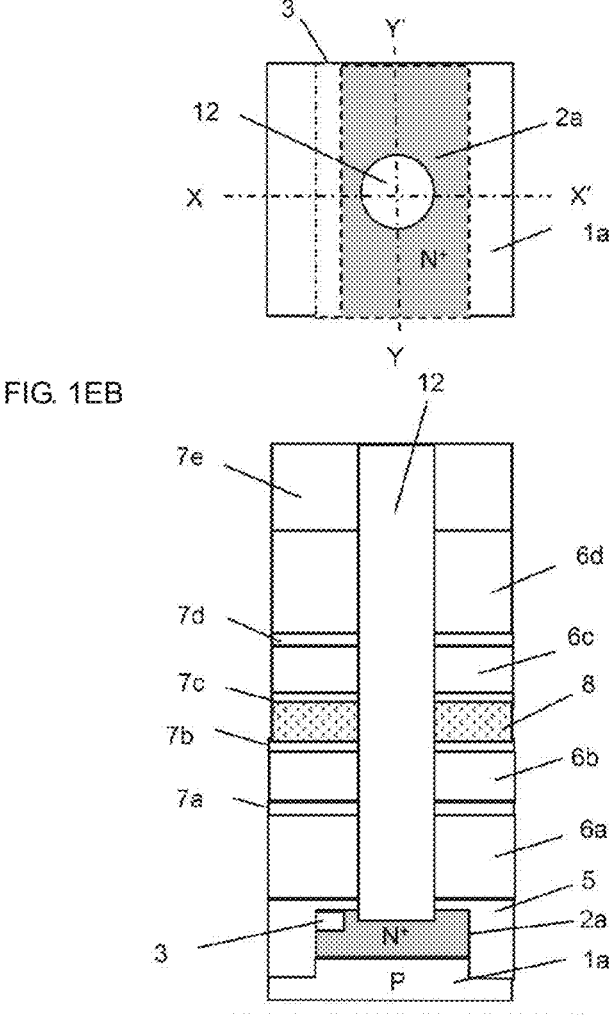
FIG. 1EB
FIG. 1EC
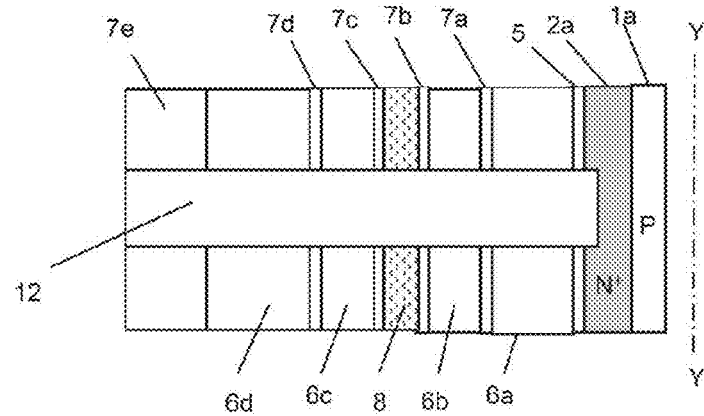

FIG. 1GA
FIG. 1GB
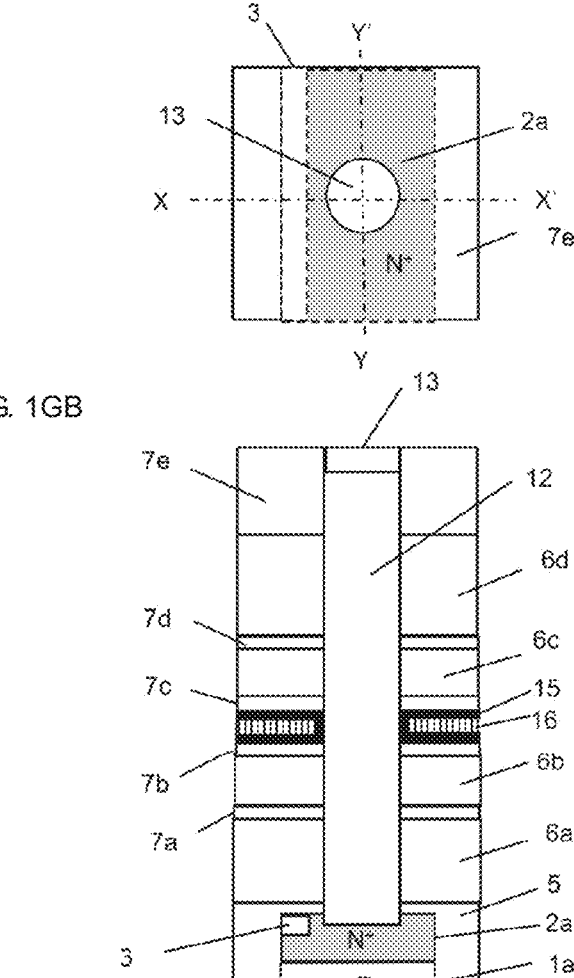
FIG. 1GC
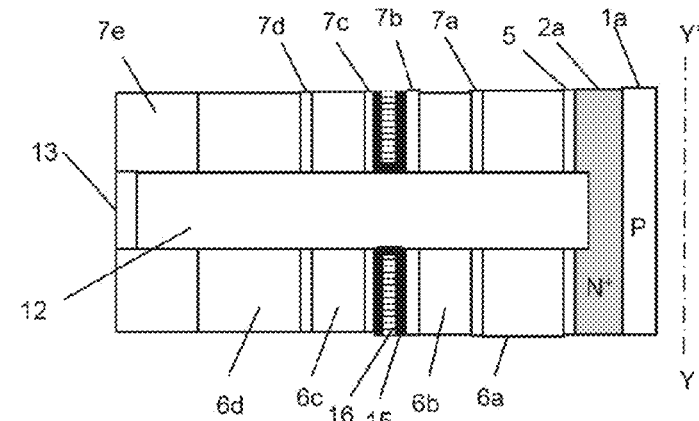

FIG. 1HA
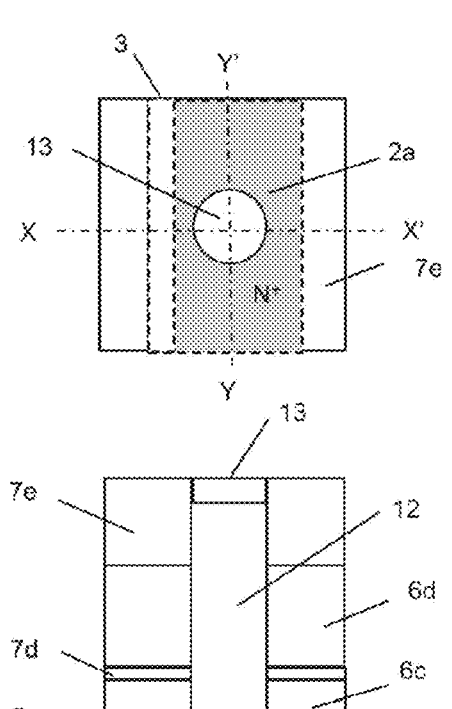
FIG. 1HB
FIG. 1HC
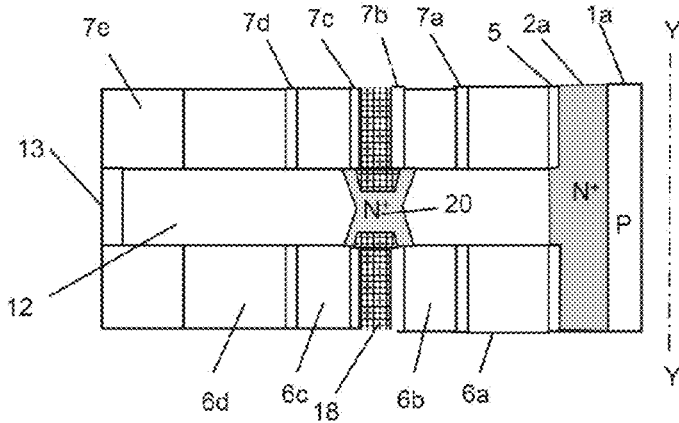

FIG. 1IA
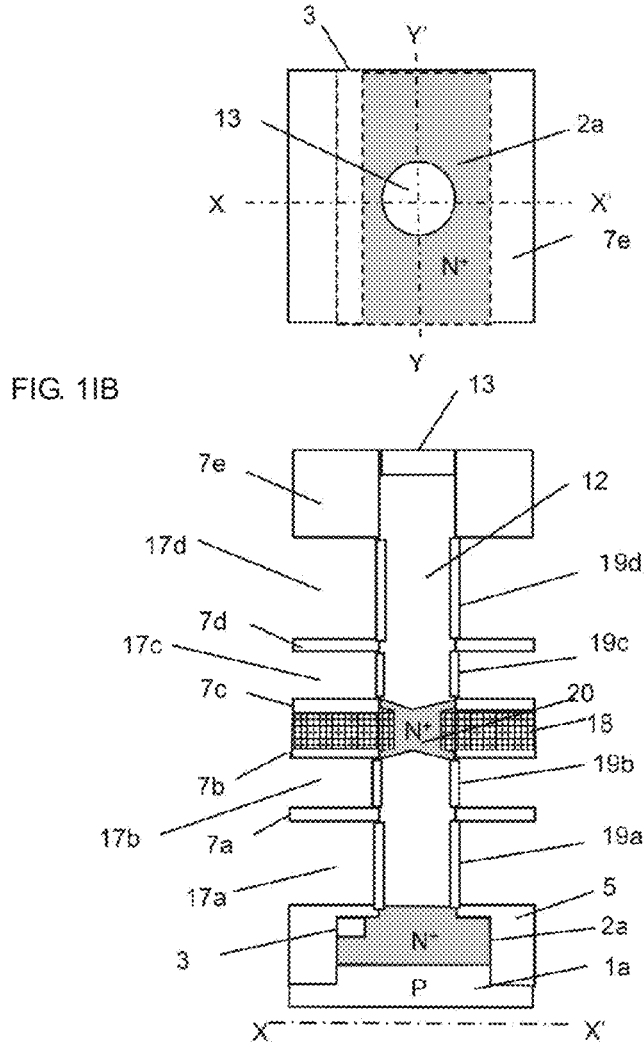
FIG. 1IB
FIG. 1IC
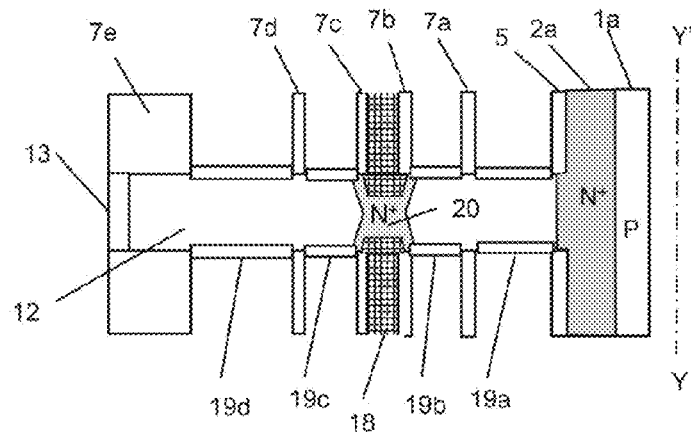

FIG. 1JA
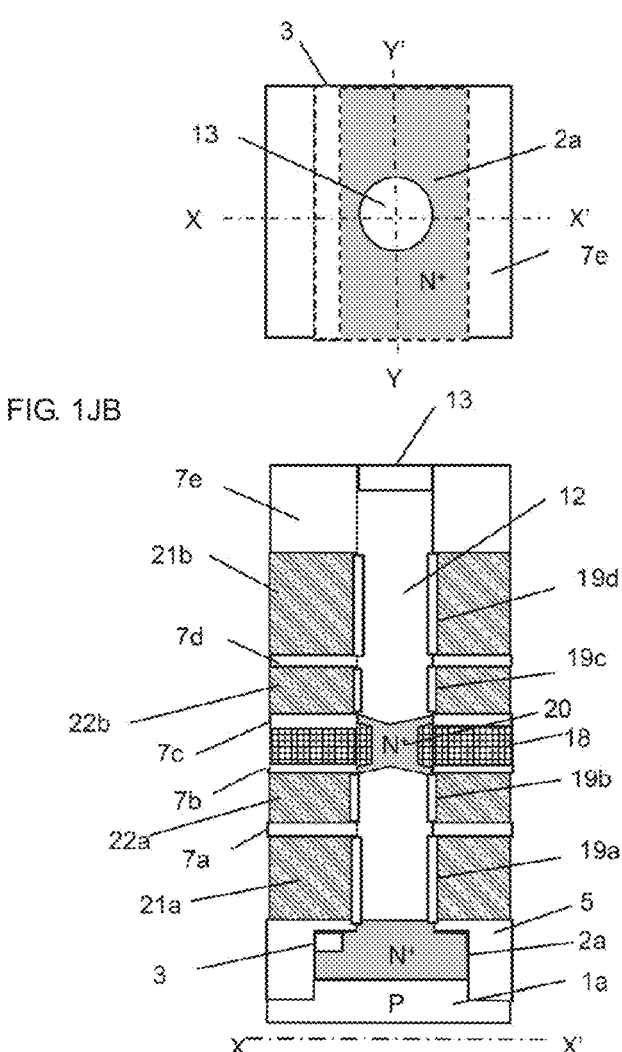
FIG. 1JB
FIG. 1JC
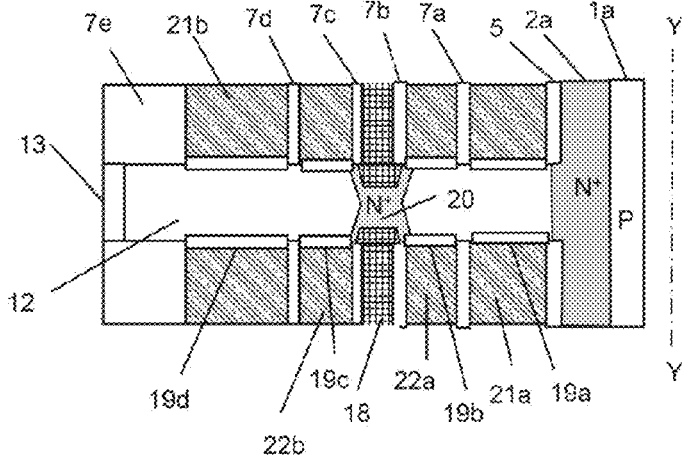

FIG. 1KA
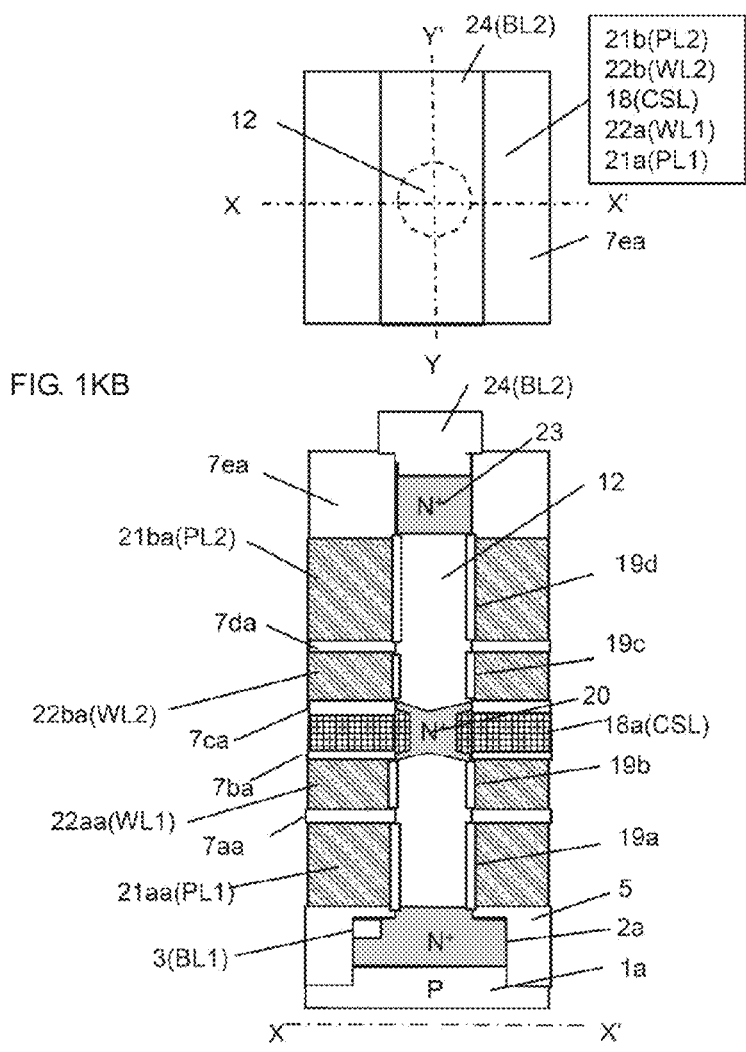
FIG. 1KB
FIG. 1KC
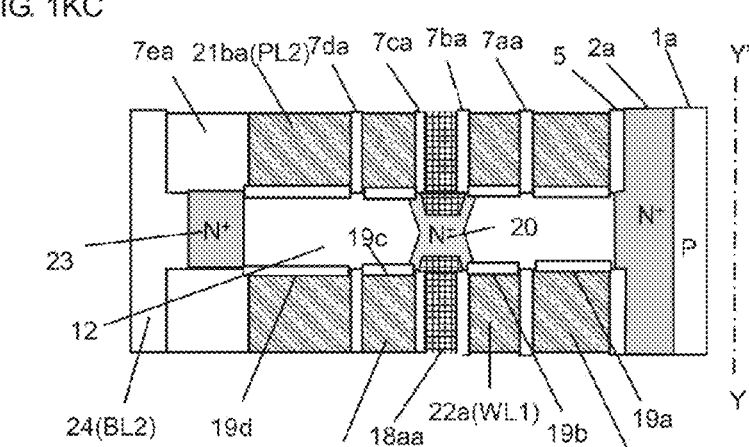

METHOD FOR MANUFACTURING SEMICONDUCTOR-ELEMENT-CONTAINING MEMORY DEVICE

CROSS-REFERENCE TO RELATED APPLICATIONS

This application claims priority to PCT/JP2022/045900, filed Dec. 13, 2022, the entire content of which is incorporated herein by reference.

BACKGROUND OF THE INVENTION

1. Field of the Invention

The present invention relates to a method for manufacturing a semiconductor-element-containing memory device.

2. Description of the Related Art

In recent years, in the development of large scale integration (LSI) technologies, there has been a need for high integration density and high performance of memory elements.

Memory elements with high density and high performance are increasingly being fabricated. Examples of such memory elements include memory elements that use a surrounding gate transistor (SGT) as a select transistor. Examples of the memory elements include dynamic random access memories (DRAMs) in which a capacitor is connected; phase change memories (PCMs) in which a resistive change element is connected; resistive random access memories (RRAM); and magneto-resistive random access memories (MRAM) configured such that a resistance is changed by changing a direction of magnetic spin by using a current. For SGTs, see, for example, Japanese Unexamined Patent Application Publication No. 2-188966 and Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991). For the DRAMs, see, for example, H. Chung, H. Kim, H. Kim, K. Kim, S. Kim, K. W. Song, J. Kim, Y. C. Oh, Y. Hwang, H. Hong, G. Jin, and C. Chung: "4F2 DRAM Cell with Vertical Pillar Transistor (VPT)," 2011 Proceeding of the European Solid-State Device Research Conference, (2011). For the PCMs, see, for example, H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No. 12, December, pp. 2201-2227 (2010). For the RRAMs, see, for example, K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007). For the MRAMs, see, for example, W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015). Other examples of the memory elements include capacitorless DRAM memory cells configured with a single MOS transistor. See, for example, Japanese Unexamined Patent Application Publication No. 3-171768; M. G. Ertosun, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp.

405-407 (2010); J. Wan, L. Rojer, A. Zaslavsky, and S. Critoloveanu: "A Compact Capacitor-Less High-Speed DRAM Using Field Effect-Controlled Charge Regeneration," Electron Device Letters, Vol. 35, No. 2, pp. 179-181 (2012); T. Ohsawa, K. Fujita, T. Higashi, Y. Iwata, T. Kajiyama, Y. Asao, and K. Sunouchi: "Memory design using a one-transistor gain cell on SOI," IEEE JSSC, vol. 37, No. 11, pp. 1510-1522 (2002); T. Shino, N. Kusunoki, T. Higashi, T. Ohsawa, K. Fujita, K. Hatsuda, N. Ikumi, F. Matsuoka, Y. Kajitani, R. Fukuda, Y. Watanabe, Y. Minami, A. Sakamoto, J. Nishimura, H. Nakajima, M. Morikado, K. Inoh, T. Hamamoto, A. Nitayama: "Floating Body RAM Technology and its Scalability to 32 nm Node and Beyond," IEEE IEDM (2006); and E. Yoshida and T. Tanaka: "A Capacitorless 1T-DRAM Technology Using Gate-Induced Drain-Leakage (GIDL) Current for Low-Power and High-Speed Embedded Memory," IEEE IEDM (2006). Other examples include twin-transistor MOS transistor memory elements including a memory cell in which two MOS transistors are provided on a silicon on insulator (SOI) layer. See, for example, U.S. Patent Application Publication No. 2008/0137394 A1; U.S. Patent Application Publication No. 2003/0111681 A1; and F. Morishita, H. Noda, I. Hayashi, T. Gyohten, M. Okamoto, T. Ipposhi, S. Maegawa, K. Dosaka, and K. Arimoto: "Capacitorless Twin-Transistor Random Access Memory (TTRAM) on SOI," IEICE Trans. Electron., Vol. E90-c., No. 4 pp. 765-771 (2007). In these elements, an N+ layer that separates floating body channels of two MOS transistors and serves as a source or a drain is formed in contact with an insulating layer that is located adjacent to a substrate.

Furthermore, other examples include capacitorless dynamic flash memories configured with a MOS transistor, as illustrated in FIG. 4. See, for example, Japanese Patent No. 7057032; and K. Sakui, N. Harada, "Dynamic Flash Memory with Dual Gate Surrounding Gate Transistor (SGT)," Proc. IEEE IMW, pp. 72-75 (2021). An N+ layer 103a is disposed over a substrate 100. A pillar-shaped P layer 102 and an N+ layer 103b are disposed over the N+ layer 103a in the order stated, starting from a lower position. A first gate insulating layer 104a surrounds a lower portion of the P layer 102, and a second gate insulating layer 104b surrounds an upper portion of the P layer 102. A first gate conductor layer 105a surrounds the first gate insulating layer 104a. A second gate conductor layer 105b surrounds the second gate insulating layer 104b. The N+ layer 103a is connected to a source line SL, the N+ layer 103b is connected to a bit line BL, the first gate conductor layer 105a is connected to a plate line PL, and the second gate conductor layer 105b is connected to a word line WL. Application of a driving voltage to the N+ layers 103a and 103b, the first gate conductor layer 105a, and the second gate conductor layer 105b enables data write, data storage, data read, and data erase in the memory. There is a need for this memory device to have further improved properties and higher integration density in the future.

Other examples of the memory elements include 3D NAND flash memories. See, for example, A. Goda "Recent Progress on 3D NAND Flash Technology", Journals, Electronics, Vol. 10, issue 24, https://doi.org/10.3390/electronics10243115b (2021). NAND flash memories have a gate including a plurality of gate conductor layers that collectively correspond to the first gate conductor layer 105a and the second gate conductor layer 105b of FIG. 4. The plurality of gate conductor layers are a plurality of drain-side select gate conductor layers, a plurality of word line gate conductor layers, and a plurality of source-side select gate conductor layers, which are disposed in this order, starting from a lower position. NAND flash memories present a problem in that an increase in the number of layers of the word line gate conductor layers in a vertical direction results in a decrease in data read and write speed. A need exists to overcome this problem.

SUMMARY OF THE INVENTION

There is a need for higher integration density of dynamic flash memory cells.

To address the above-described need, a first aspect of the present invention provides a method for manufacturing a memory device. Specifically, the method is a method for manufacturing a semiconductor-element-containing memory device that includes a first memory cell configured to perform a data write operation, a data read operation, and a data erase operation by using a voltage that is applied to a first wiring layer, a second wiring layer, and a third wiring layer, the first wiring layer being connected to a first impurity layer, the second wiring layer being connected to a first gate conductor layer, a second gate conductor layer, and a second impurity layer, the third wiring layer being connected to a third gate conductor layer, a fourth gate conductor layer, and a third impurity layer, the method comprising the steps of:

forming the first impurity layer over a substrate and forming, over the first impurity layer, in a layered manner, a first insulating layer, a first material layer, a second insulating layer, a second material layer, a third insulating layer, a third material layer, a fourth insulating layer, a fourth material layer, a fifth insulating layer, a fifth material layer, and a sixth insulating layer, which are disposed in this order, starting from a lower position;

forming a first hole extending through the first to sixth insulating layers and the first to fifth material layers in a vertical direction and having a bottom portion in the first impurity layer;

filling the first hole with a first pillar-shaped semiconductor layer;

removing the third material layer to form a first space;

forming a first semiconductor layer in contact with an inner wall of the first space with a portion of the first space being left unfilled, the first semiconductor layer containing a donor impurity or an acceptor impurity;

forming a first alloy layer that is made of an alloy or a metal and fills the portion of the first space that is inside the first semiconductor layer:

performing a heat treatment, thereby causing the first semiconductor layer and the first alloy layer to be integrated with each other to form a second alloy layer and also causing the donor impurity or the acceptor impurity of the first semiconductor layer to diffuse into the first pillar-shaped semiconductor layer to form the second impurity layer;

removing the first material layer, the second material layer, the fourth material layer, and the fifth material layer to form a second space and forming a first gate insulating layer that covers at least an exposed portion of a side surface of the first pillar-shaped semiconductor layer in the second space;

forming a first conductor layer, a second conductor layer, a third conductor layer, and fourth conductor layer, which are disposed in this order, starting from a lower position, and fill the second space;

etching, with a single mask, the second alloy layer, the first to fourth conductor layers, and the second to sixth insulating layers to form the first to fourth gate conductor layers and the second wiring layer such that the first to fourth gate conductor layers and the second wiring layer have substantially the same shape as viewed in plan view;

forming the third impurity layer on a top portion of the first pillar-shaped semiconductor layer; and forming the third wiring layer that is connected to the third impurity layer, the third wiring layer extending in the same direction as the first wiring layer and being perpendicular to the second wiring layer, as viewed in plan view.

In a second aspect of the present invention, the method of the first aspect further comprises the step of connecting the first wiring layer to a first bit line, connecting the second wiring layer to a common source line, and connecting the third wiring layer to a second bit line.

In a third aspect of the present invention, the method of the first aspect further comprises the steps of:

connecting one of the first gate conductor layer and the second gate conductor layer to a first plate line and connecting another of the first gate conductor layer and the second gate conductor layer to a first word line;

connecting the third gate conductor layer to one of a second plate line and a second word line that has the same driving purpose as the second gate conductor layer; and connecting the fourth gate conductor layer to one of the second plate line and the second word line that has the same driving purpose as the first gate conductor layer.

In a fourth aspect of the present invention, the method of the first aspect is one in which the forming of the first to fourth conductor layers that fill the second space is performed before the forming of the second alloy layer.

In a fifth aspect of the present invention, the method of the first aspect is one in which the forming of the first to fourth conductor layers that fill the second space is performed after the forming of the second alloy layer.

In a sixth aspect of the present invention, the method of the first aspect is one in which the first semiconductor layer comprises a donor impurity or an acceptor impurity and comprises at least silicon atoms.

In a seventh aspect of the present invention, the method of the first aspect is one in which the first alloy layer comprises at least nickel atoms.

In an eighth aspect of the present invention, the method of the first aspect is one in which the first and fourth gate conductor layers and one or both of the second and third gate conductor layers are formed to each comprise a plurality of layers disposed in the vertical direction.

In a ninth aspect of the present invention, the method of the first aspect is one in which the first to fourth gate conductor layers and the second wiring layer are formed to each comprise two layers having the same shape as viewed in plan view.

In a tenth aspect of the present invention, the method of the first aspect is one in which the first to fourth gate conductor layers are formed to have the same height in the vertical direction.

In an eleventh aspect of the present invention, the method of the first aspect further comprises forming a second memory cell over the first pillar-shaped semiconductor layer with a process that is substantially the same as the process for the first memory cell and by using the third impurity layer as a common impurity layer, the second memory cell having a structure in which upper and lower positions are reversed in the vertical direction compared to the upper and lower positions of the first memory cell, the method comprising the steps of:

forming the third wiring layer such that the third wiring layer is connected to a side surface of the third impurity layer and extends in a direction perpendicular to the second conductor layer as viewed in plan view;

forming a second pillar-shaped semiconductor layer over the third impurity layer;

forming a fifth gate conductor layer, a sixth gate conductor layer, a fourth wiring layer, a seventh gate conductor layer, and an eighth gate conductor layer, which are disposed in this order, starting from a lower position, and are isolated from one another, the fourth wiring layer being connected to a fourth impurity layer formed in the second pillar-shaped semiconductor layer;

forming a second gate insulating layer that is disposed between the second pillar-shaped semiconductor layer and the fifth to eighth gate conductor layers;

forming a fifth impurity layer on a top portion of the second pillar-shaped semiconductor layer; and forming a fifth wiring layer that is connected to the fifth impurity layer and extends in the same direction as the third wiring layer as viewed in plan view, wherein the fifth to eighth gate conductor layers and the fourth wiring layer are formed to substantially have the same shape as and overlap with the first to fourth gate conductor layers and the second wiring layer, as viewed in plan view.

In a twelfth aspect of the present invention, the method of the eleventh aspect further comprises the steps of:

connecting the third wiring layer to a common bit line of the first and second memory cells;

connecting one of the fifth gate conductor layer and the sixth gate conductor layer to a third plate line and connecting another of the fifth gate conductor layer and the sixth gate conductor layer to a third word line;

connecting the seventh gate conductor layer to one of a fourth plate line and a fourth word line that has the same driving purpose as the sixth gate conductor layer; and connecting the eighth gate conductor layer to one of the fourth plate line and the fourth word line that has the same driving purpose as the fifth gate conductor layer.

In a thirteenth aspect of the present invention, the method of the first aspect is one in which the first wiring layer is formed to surround a portion or an entirety of an outer peripheral portion of a bottom portion of the first pillar-shaped semiconductor layer, as viewed in plan view, and to be connected to the first impurity layer.

In a fourteenth aspect of the present invention, the method of the first aspect is one in which the first to fourth gate conductor layers and the second wiring layer have the same shape and extend two-dimensionally, as viewed in plan view, and are connected to adjacent memory cells.

In a fifteenth aspect of the present invention, the method of the first aspect is one in which the first and fourth gate conductor layers are formed to each comprise a plurality of gate electrode conductor layers that constitute a first drain-side select gate conductor layer, a plurality of first word line gate conductor layers, a first source-side select gate conductor layer, a second source-side select gate conductor layer, a plurality of second word line gate conductor layers, and a second drain-side select gate conductor layer, which are disposed in this order, starting from a lower position, the first pillar-shaped semiconductor layer is formed to include or not to include an insulating layer in a middle portion, and the first insulating layer is formed to include a floating conductor layer or a charge trap layer, the first insulating layer surrounding the first pillar-shaped semiconductor layer and the first and second word line gate conductor layers, the floating conductor layer being electrically isolated from the first pillar-shaped semiconductor layer and the first and second word line gate conductor layers, the charge trap layer being made of an insulating layer.

In a sixteenth aspect of the present invention, the method of the fifteenth aspect is one in which the first drain-side select gate conductor layer and the second drain-side select gate conductor layer each comprise a plurality of gate conductor layers.

BRIEF DESCRIPTION OF THE DRAWINGS

FIGS. 1DA, 1DB, and 1DC are diagrams used to illustrate the method for manufacturing a two-stage dynamic flash memory cell according to the embodiment;

FIGS. 1EA, 1EB, and 1EC are diagrams used to illustrate the method for manufacturing a two-stage dynamic flash memory cell according to the embodiment;

FIGS. 1GA, 1GB, and 1GC are diagrams used to illustrate the method for manufacturing a two-stage dynamic flash memory cell according to the embodiment;

FIGS. 1HA, 1HB, and 1HC are diagrams used to illustrate the method for manufacturing a two-stage dynamic flash memory cell according to the embodiment;

FIGS. 1IA, 1IB, and 1IC are diagrams used to illustrate the method for manufacturing a two-stage dynamic flash memory cell according to the embodiment;

FIGS. 1JA, 1JB, and 1JC are diagrams used to illustrate the method for manufacturing a two-stage dynamic flash memory cell according to the embodiment;

FIGS. 1KA, 1KB, and 1KC are diagrams used to illustrate the method for manufacturing a two-stage dynamic flash memory cell according to the embodiment;

DESCRIPTION OF THE PREFERRED EMBODIMENTS

Methods according to embodiments of the present invention for manufacturing a semiconductor-element-containing memory device will be described below with reference to the drawings. The memory device will hereinafter be referred to as a dynamic flash memory.

A method for manufacturing a two-stage dynamic flash memory cell according to an embodiment of the present invention will be described with reference to FIGS. 1AA to 1KC. Regarding the designation of each of the figures, "A" at the end of the designation denotes a plan view of the two-stage dynamic flash memory cell, "B" at the end of the designation denotes a cross-sectional view taken along line X-X' of the figure of "A", and "C" at the end of the designation denotes a cross-sectional view taken along line Y-Y' of the figure of "A". Actual dynamic flash memories include a two-dimensional array of a large number of the two-stage dynamic flash memory cells. The present embodiment describes an instance in which the signal charges of the dynamic flash memory cell are electron holes.

Figure 1A:
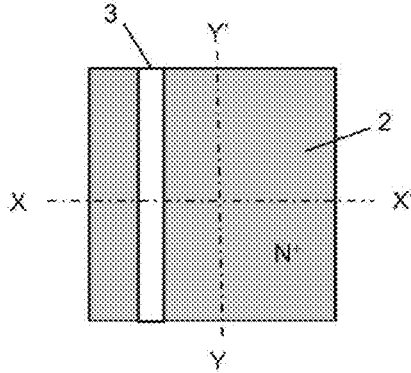
FIGS. 1AA, 1AB, and 1AC are diagrams used to illustrate a method for manufacturing a two-stage dynamic flash memory cell according to an embodiment.
Figure 1A:
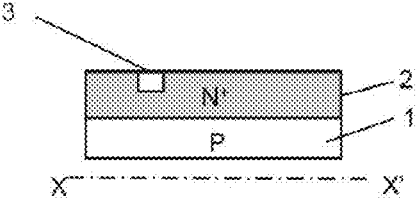
Figure 1A:
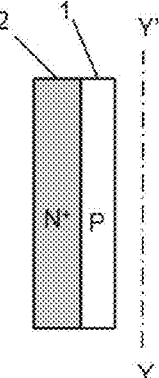

As illustrated in FIGS. 1AA to 1AC, an N$^+$ layer 2 is formed over a P layer substrate 1 (an example of the substrate recited in the claims). Thereafter, a conductor layer 3 (an example of the first wiring layer recited in the claims) is formed in an upper portion of the N$^+$ layer 2. The conductor layer 3 extends in a direction of line Y-Y'.

Figure 1B:
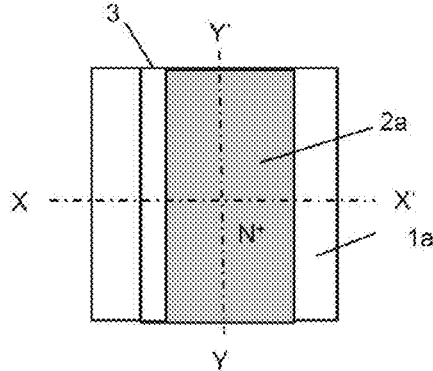
FIGS. 1BA, 1BB, and 1BC are diagrams used to illustrate the method for manufacturing a two-stage dynamic flash memory cell according to the embodiment.
Figure 1B:
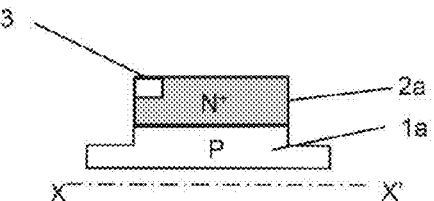
Figure 1B:
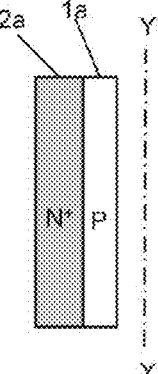

Next, as illustrated in FIGS. 1BA to 1BC, a P layer substrate 1a and an N$^+$ layer 2a (an example of the first impurity layer recited in the claims) are formed. The P layer substrate 1a and the N$^+$ layer 2a extend in the direction of line Y-Y' and include the conductor layer 3.

Figure 1C:
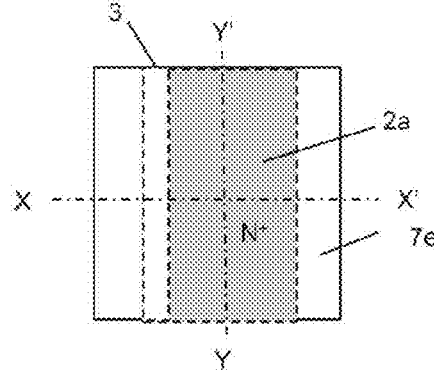
FIGS. 1CA, 1CB, and 1CC are diagrams used to illustrate the method for manufacturing a two-stage dynamic flash memory cell according to the embodiment.
Figure 1C:
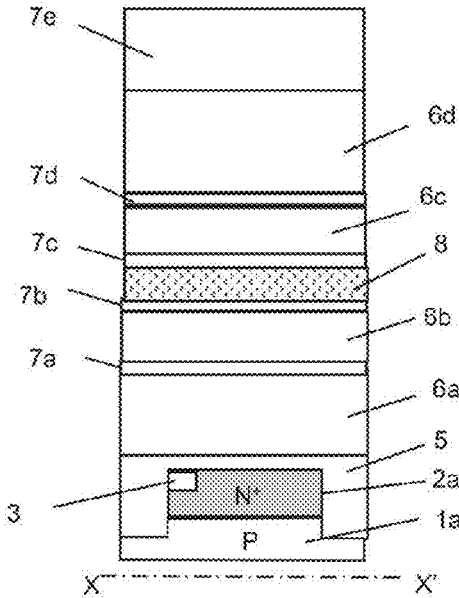
Figure 1C:
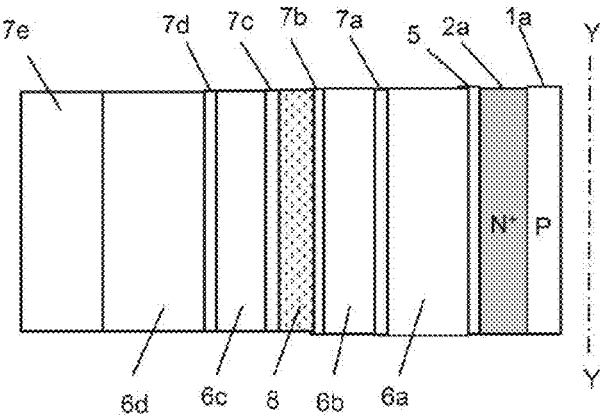

Next, as illustrated in FIGS. 1CA to 1CC, a first insulating layer 5 (an example of the first insulating layer recited in the claims) is formed. The first insulating layer 5 covers the P layer substrate 1a, the N$^+$ layer 2a, and the conductor layer 3. Next, the following layers are formed: a first material layer 6a (an example of the first material layer recited in the claims), a second insulating layer 7a (an example of the second insulating layer recited in the claims), a second material layer 6b (an example of the second material layer recited in the claims), a third insulating layer 7b (an example of the third insulating layer recited in the claims), a third material layer 8 (an example of the third material layer recited in the claims), a fourth insulating layer 7c (an example of the fourth insulating layer recited in the claims), a fourth material layer 6c (an example of the fourth material layer recited in the claims), a fifth insulating layer 7d (an example of the fifth insulating layer recited in the claims), a fifth material layer 6d (an example of the fifth material layer recited in the claims), and a sixth insulating layer 7e (an example of the sixth insulating layer recited in the claims). These layers are disposed in the order stated, starting from a lower position.

Next, as illustrated in FIGS. 1DA to 1DC, a hole 10 (an example of the first hole recited in the claims) is formed. The hole 10 extends through the first insulating layer 5, the first material layer 6a, the second insulating layer 7a, the second material layer 6b, the third insulating layer 7b, the third material layer 8, the fourth insulating layer 7c, the fourth material layer 6c, the fifth insulating layer 7d, the fifth material layer 6d, and the sixth insulating layer 7e. A bottom portion of the hole 10 is located in an upper portion of the N$^+$ layer 2a.

Next, as illustrated in FIGS. 1EA to 1EC, a silicon (Si) pillar 12 (an example of the first pillar-shaped semiconductor layer recited in the claims) is formed to fill the hole 10. The Si pillar 12 is formed, for example, with an epitaxial growth method and a chemical mechanical polishing (CMP) method.

Figure 1F:
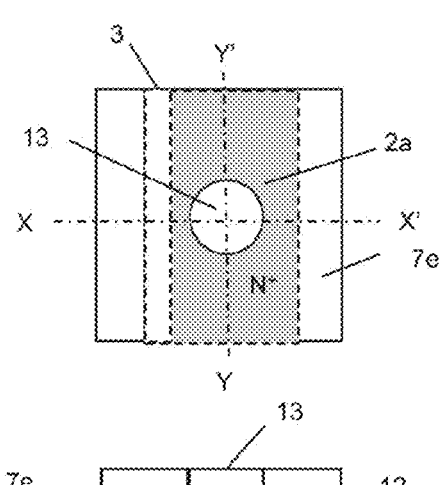
FIGS. 1FA, 1FB, and 1FC are diagrams used to illustrate the method for manufacturing a two-stage dynamic flash memory cell according to the embodiment.
Figure 1F:
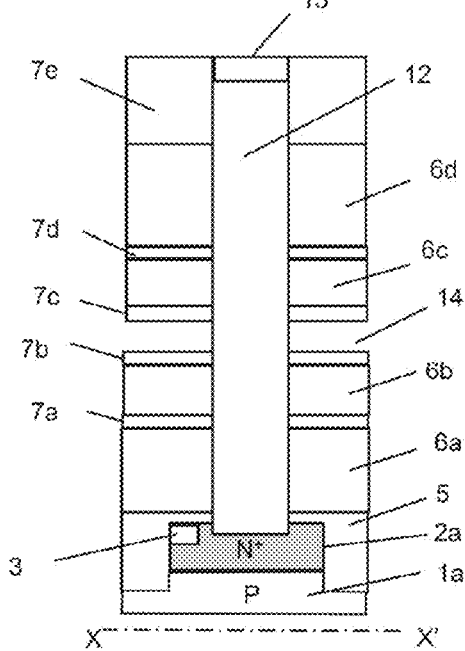
Figure 1F:
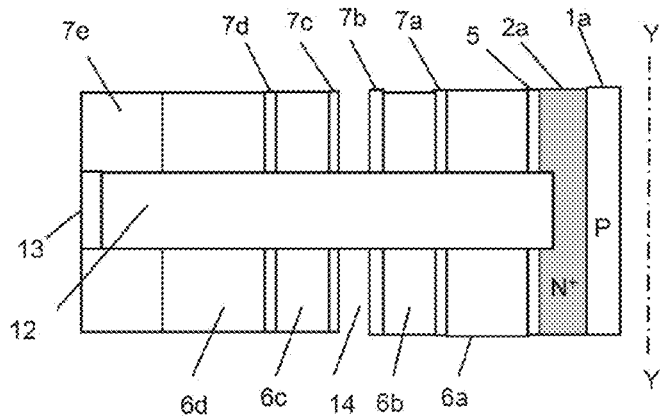

Next, as illustrated in FIGS. 1FA to 1FC, a protective layer 13 is formed on an upper surface of the Si pillar 12. The protective layer 13 is made of, for example, a silicon oxide (SiO$_2$) film, a silicon nitride (SiN) film, or the like. Thereafter, the third material layer 8 is removed by etching to form a space 14 (an example of the first space recited in the claims).

Next, as illustrated in FIGS. 1GA to 1GC, a doped poly-Si layer 15 (an example of the first semiconductor layer recited in the claims) is formed to cover an inner surface of the space 14. The doped poly-Si layer 15 contains a donor impurity. In this instance, the doped poly-Si layer 15 is formed such that a portion of the space 14 is left between the third insulating layer 7b and the fourth insulating layer 7c. Thereafter, a silicide layer 16 (an example of the first alloy layer recited in the claims), which contains nickel (Ni), is formed to fill the remaining portion of the space 14. Note that the silicide layer 16 may be a layer containing a metal other than Ni. Alternatively, the silicide layer 16 may be a layer made of elemental Ni.

Next, referring to FIGS. 1HA to 1HC, a heat treatment is performed. This causes the doped poly-Si layer 15 to be silicided to form a silicide layer 18 (an example of the second alloy layer recited in the claims) in the entirety of the space 14. In addition to causing the formation of the silicide layer 18, the heat treatment also causes the donor impurity present in the doped poly-Si layer 15 to be forced out into the Si pillar 12 to form an N$^+$ layer 20 (an example of the second impurity layer recited in the claims). The silicide layer 18 spreads into the Si pillar 12. Next, as illustrated in FIGS. 1IA to 1IC, the first material layer 6a, the second material layer 6b, the fourth material layer 6c, and the fifth material layer 6d are removed to form spaces 17a, 17b, 17c, and 17d (an example of the second space recited in the claims), which are disposed in this order, starting from a lower position, in a vertical direction.

Next, as illustrated in FIGS. 1IA to 1IC, portions of a surface layer of the Si pillar 12 that are exposed in the spaces 17a, 17b, 17c, and 17d are oxidized to form oxide layers 19a, 19b, 19c, and 19d (an example of the first gate insulating layer recited in the claims).

Next, as illustrated in FIGS. 1JA to 1JC, a first conductor layer 21a (an example of the first conductor layer recited in the claims), a second conductor layer 22a (an example of the second conductor layer recited in the claims), a third conductor layer 22b (an example of the third conductor layer recited in the claims), and a fourth conductor layer 21b (an example of the fourth conductor layer recited in the claims) are formed to fill the spaces that have the formed oxide layers 19a, 19b, 19c, and 19d. The conductor layers are disposed in the order stated, starting from a lower position.

Next, as illustrated in FIGS. 1KA to 1KC, the sixth insulating layer 7e, the fourth conductor layer 21b, the fifth insulating layer 7d, the third conductor layer 22b, the fourth insulating layer 7c, the silicide layer 18, the third insulating layer 7b, the second conductor layer 22a, the second insulating layer 7a, and the first conductor layer 21a, which are disposed in this order, starting from an upper position, are etched with a single etching mask such that these layers have the same shape as viewed in plan view. As a result, the following layers are formed: a sixth insulating layer 7ea, a fourth gate conductor layer 21ba (an example of the fourth gate conductor layer recited in the claims), a fifth insulating layer 7da, a third gate conductor layer 22ba (an example of the third gate conductor layer recited in the claims), a fourth insulating layer 7ca, a silicide layer 18a (an example of the second wiring layer recited in the claims), a third insulating layer 7*ba*, a second gate conductor layer 22*aa* (an example of the second gate conductor layer recited in the claims), a second insulating layer 7*aa*, and a first gate conductor layer 21*aa* (an example of the first gate conductor layer recited in the claims). An insulating layer (not illustrated) is formed on an outer peripheral portion such that an upper surface of the insulating layer is flush with an upper surface of the sixth insulating layer 7*ea*. The protective layer 13 is removed. An $N^+$ layer 23 (an example of the third impurity layer recited in the claims) is formed on a top portion of the Si pillar 12. A metal wiring 24 (an example of the third wiring layer recited in the claims), which is connected to the $N^+$ layer 23 and extends in the direction of line Y-Y', is formed. The conductor layer 3 is connected to a first bit line BL1, the first gate conductor layer 21*aa* is connected to a first plate line PL1, the second gate conductor layer 22*aa* is connected to a first word line WL1, the silicide layer 18*a* is connected to a common source line CSL, the third gate conductor layer 22*ba* is connected to a second word line WL2, and the fourth gate conductor layer 21*ba* is connected to a second plate line PL2. This completes the formation of the two-stage dynamic flash memory cell. The sixth insulating layer 7*ea*, the fourth gate conductor layer 21*ba*, the fifth insulating layer 7*da*, the third gate conductor layer 22*ba*, the fourth insulating layer 7*ca*, the silicide layer 18*a*, the third insulating layer 7*ba*, the second gate conductor layer 22*aa*, the second insulating layer 7*aa*, and the first gate conductor layer 21*aa*, which have been formed with a single etching mask, extend in a direction perpendicular to the conductor layer 3, which is connected to the first bit line BL1, and the metal wiring 24, which is connected to the second bit line BL2, as viewed in plan view.

FIGS. 1KA to 1KC illustrate the two-stage dynamic flash memory cell that has been formed on the P layer substrate 1*a* and in which the $N^+$ layer 20 connected to the common source line CSL serves as a common $N^+$ layer; the two-stage dynamic flash memory cell is made of two dynamic flash memory cells, in which upper and lower positions of one of the two dynamic flash memory cells are reversed compared to those of the other.

The doped poly-Si layer 15 illustrated in FIGS. 1GB and 1GC, which contains a donor impurity, may be a layer made of another semiconductor, such as silicon germanium (SiGe). The semiconductor layer may be formed with a method such as atomic layer deposition (ALD), chemical vapor deposition (CVD), or the like.

The formation of the $N^+$ layer 20 is illustrated as being performed in the step of FIGS. 1HA to 1HC; however, the N+ layer 20 may be formed at any suitable stage of the present method by performing the heat treatment before the end of the final step of FIGS. 1KA to 1KC in a manner such that the N+ layer 20 is present on the entirety of the Si pillar 12 as viewed in plan view. In addition, the formation of the silicide layer 18 may be performed after the formation of the first to fourth conductor layers 21*a*, 21*b*, 22*a*, and 22*b*.

The Si pillar 12 may be formed of another semiconductor material. The Si pillar 12 may have a horizontal cross section that is circular, rectangular, or ellipsoidal. The Si pillar 12 may have a vertical cross section that is rectangular or trapezoidal.

FIGS. 1IA to 1IC illustrate that the oxide layers 19*a*, 19*b*, 19*c*, and 19*d* are formed by oxidizing the portions of the surface layer of the Si pillar 12 that are exposed. Alternatively, a gate insulating layer made of one or more layers may be formed on surface layers of the spaces, which include the exposed portions of the surface layer of the Si pillar 12, and the one or more layers may be, for example, $SiO_2$ or hafnium oxide ($HfO_2$) layers, which may be formed with an ALD method or the like.

FIGS. 1KA to 1KC illustrate that the first gate conductor layer 21*aa* is connected to the first plate line PL1, the second gate conductor layer 22*aa* is connected to the first word line WL1, the third gate conductor layer 22*ba* is connected to the second word line WL2, and the fourth gate conductor layer 21*ba* is connected to the second plate line PL2. Alternatively, the first gate conductor layer 21*aa* may be connected to the first word line WL1, the second gate conductor layer 22*aa* may be connected to the first plate line PL1, the third gate conductor layer 22*ba* may be connected to the second plate line PL2, and the fourth gate conductor layer 21*ba* may be connected to the second word line WL2. In this case, too, the dynamic flash memory can operate normally.

The first to fourth gate conductor layers 21*aa*, 22*aa*, 21*ba*, and 22*ba* may have the same length in the vertical direction. Some or all of the first to fourth gate conductor layers 21*aa*, 22*aa*, 21*ba*, and 22*ba* may be isolated from one another in the vertical direction. The some or all of the first to fourth gate conductor layers 21*aa*, 22*aa*, 21*ba*, and 22*ba* that have been isolated are driven synchronously or asynchronously. In this case, too, the dynamic flash memory can operate normally.

The conductor layer 3 is illustrated as being formed on the $N^+$ layer 2*a* on one side of the P layer substrate 1*a* and extending in the direction of line Y-Y', as viewed in plan view. Alternatively, the conductor layer 3 may be formed on the $N^+$ layer 2*a* on both sides of the P layer substrate 1*a*, as viewed in plan view. The conductor layer 3 may be formed in a lower portion of the $N^+$ layer 2*a*. Although the $N^+$ layer 2*a* is illustrated as being formed on a projecting portion of the P layer substrate 1*a*, the $N^+$ layer 2*a* may alternatively be formed in a planar manner on a P layer substrate 1*a* having a flat upper surface and be connected to an adjacent memory cell. Thus, the $N^+$ layer 2*a* may have any of a variety of shapes, depending on the design requirements. The same applies to the formation of the $N^+$ layer 23.

In an instance where the Si pillar 12 is disposed in a two-dimensional configuration as viewed in plan view, any configuration may be employed for the two-dimensional disposition. Examples of the configuration include square lattice configurations, oblique lattice configurations, honeycomb configurations, zigzag configurations, and saw blade configurations.

The method for manufacturing a two-stage dynamic flash memory illustrated in FIGS. 1AA to 1KC can be applied to a method for manufacturing a three or more-stage dynamic flash memory.

A CMOS circuit insulated from the $N^+$ layer 2*a* may be formed in a portion that is within the P layer substrate 1*a* and under the $N^+$ layer 2*a*. In this case, a CMOS circuit is provided under the dynamic flash memory region.

Furthermore, this manufacturing method can be applied to the manufacture of a 3D NAND flash memory. See, for example, A. Goda "Recent Progress on 3D NAND Flash Technology", Journals, Electronics, Vol. 10, issue 24, https://doi.org/10.3390/electronics10243115b (2021).

The above-described embodiment is an example in which the signal charges that are stored in the Si pillar 12 are electron holes. Alternatively, the signal charges may be electrons, and in this case, the $N^+$ layers 2*a*, 20, and 23 are replaced with $P^+$ layers.

The present embodiment has the following features.

(1) As illustrated in FIGS. 1FA to 1HC, the third material layer 8 is removed by etching to form the space 14, the doped poly-Si layer 15 containing a donor impurity is formed to cover the inner surface of the space 14, and the silicide layer 16 containing nickel (Ni) is formed to fill the remaining portion of the space. Thereafter, a heat treatment is performed to cause the doped poly-Si layer 15 to be silicided to form the silicide layer 18, and in addition, the heat treatment produces an effect of forcing the donor impurity present in the doped poly-Si layer 15 out into the Si pillar 12 to form the N$^+$ layer 20. Thus, the N$^+$ layer 20, which is connected to the common source line CSL of the Si pillar 12, and the silicide layer 18, which is a wiring electrode connected to the common source line CSL, are simultaneously formed by self alignment. Accordingly, the formation of the N$^+$ layer 20 and the silicide layer 18 that is a wiring electrode can be easily accomplished, and the performance of the two-stage dynamic flash memory is improved as a result of the formation by self alignment of the N$^+$ layer 20 and the silicide layer 18 that is a wiring electrode.

(2) The position in the vertical direction of the N$^+$ layer 20, which is connected to the common source line CSL, is defined by the position of the third material layer 8, which is formed in the process in which the first material layer 6a, the second insulating layer 7a, the second material layer 6b, the third insulating layer 7b, the third material layer 8, the fourth insulating layer 7c, the fourth material layer 6c, the fifth insulating layer 7d, the fifth material layer 6d, and the sixth insulating layer 7e, which are disposed in this order, starting from a lower position, are formed, as illustrated in FIGS. 1CB and 1CC. The first material layer 6a, the second insulating layer 7a, the second material layer 6b, the third insulating layer 7b, the third material layer 8, the fourth insulating layer 7c, the fourth material layer 6c, the fifth insulating layer 7d, the fifth material layer 6d, and the sixth insulating layer 7e are formed sequentially in a layered manner on an entire surface of a wafer, with a CVD method, an ALD method, or the like. This layered-manner formation does not involve any processes in a plan view direction throughout the steps, and, therefore, the formation is achieved with high precision in the vertical direction. Accordingly, the method for manufacturing a two-stage dynamic flash memory can be implemented easily, and improvement in performance is achieved.

(3) The sixth insulating layer 7e, the fourth conductor layer 21b, the fifth insulating layer 7d, the third conductor layer 22b, the fourth insulating layer 7c, the silicide layer 18, the third insulating layer 7b, the second conductor layer 22a, the second insulating layer 7a, and the first conductor layer 21a, which are disposed in this order, starting from an upper position, are etched with a single etching mask such that these layers have the same shape as viewed in plan view, and as a result, as illustrated in FIGS. 1KB and 1KC, the following layers are formed: the sixth insulating layer 7ea, the fourth gate conductor layer 21ba, the fifth insulating layer 7da, the third gate conductor layer 22ba, the fourth insulating layer 7ca, the silicide layer 18a, the third insulating layer 7ba, the second gate conductor layer 22aa, the second insulating layer 7aa, and the first gate conductor layer 21aa. Thus, the formation of the fourth gate conductor layer 21ba, the third gate conductor layer 22ba, the silicide layer 18a, the second gate conductor layer 22aa, and the first gate conductor layer 21aa, which are the wiring conductor layers of the two-stage dynamic flash memory cell in which the N$^+$ layer 20 connected to the common source line CSL and serves as a common N$^+$ layer, is accomplished with substantially a single mask. Thus, the fourth gate conductor layer 21ba, the third gate conductor layer 22ba, the silicide layer 18a, the second gate conductor layer 22aa, and the first gate conductor layer 21aa are formed by self alignment. Consequently, the method for manufacturing a two-stage dynamic flash memory can be implemented easily and with high precision, and improvement in performance is achieved.

(4) Dynamic flash memory cells include the oxide layers 19a, 19b, 19c, and 19d, which are gate insulating layers, and the first to fourth conductor layers 21a, 22a, 21b, and 22b, which are gate conductor layers, with the oxide layers and the conductor layers surrounding the Si pillar 12. In contrast, a floating-gate 3D NAND flash memory, for example, has a word line portion in which a tunnel oxide layer, which serves as an insulating layer, a floating conductor layer, an insulating layer, and a control conductor layer are formed to cover a channel semiconductor layer, which extends in a direction perpendicular to the substrate. If the floating gate conductor layer, the insulating layer, and the control electrode conductor layer are regarded as one gate conductor layer portion, the gate conductor layer portion is equivalent to the first and second plate line PL1 and PL2 portion and the first and second word line WL1 and WL2 portion of the dynamic flash memory cell, in terms of a basic structure. See, for example, A. Goda "Recent Progress on 3D NAND Flash Technology", Journals, Electronics, Vol. 10, issue 24, https://doi.org/10.3390/electronics10243115b (2021). Furthermore, a select gate at the source-side (SGS), a select gate at the source-side (SGS) in a select gate at the drain-side (SGD) portion, and a select gate at the drain-side (SGD) are equivalent to the first and second plate line PL1 and PL2 portion and the first and second word line WL1 and WL2 portion of the dynamic flash memory cell, in terms of a basic structure. In this case, the select gate at the source-side and the select gate at the drain-side may each be made up of a plurality of gate conductor layers in accordance with design requirements. Thus, a method for manufacturing a 3D NAND flash memory can use the same method as the above-described method for manufacturing a two-stage dynamic flash memory cell, to form a two-stage 3D NAND flash memory cell that includes upper and lower 3D NAND flash memory cells with an N$^+$ layer connected to a source line being provided at an intermediate position. The same applies to a charge-trap 3D NAND flash memory, in which the storage of signal charges is carried out in a charge trap layer made of, for example, a silicon nitride (SiN) layer. A method for manufacturing this 3D NAND flash memory can also use the same method as the method of the present embodiment to form, at a position along a vertically extending channel semiconductor pillar, an N$^+$ layer connected to a common source line. Consequently, high integration density and high speed are achieved in the 3D NAND flash memory. Note that the channel semiconductor layer may include an insulating layer provided at a cross-sectional middle portion. Furthermore, repeatedly performing the process enables realization of a multi-stage 3D NAND flash memory.

A method for manufacturing a two-stage dynamic flash memory cell according to another embodiment of the present invention will be described with reference to FIGS. 2A to 2C. Regarding the designation of each of the figures, "A" at the end of the designation denotes a plan view of the two-stage dynamic flash memory cell, "B" at the end of the designation denotes a cross-sectional view taken along line X-X' of the figure of "A", and "C" at the end of the designation denotes a cross-sectional view taken along line Y-Y' of the figure of "A". Actual dynamic flash memories include a two-dimensional array of a large number of the two-stage dynamic flash memory cells.

The above description of the method for manufacturing the two-stage dynamic flash memory cell of FIGS. 1AA to 1KC describes an instance in which the fourth gate conductor layer 21$ba$, the third gate conductor layer 22$ba$, the silicide layer 18$a$, the second gate conductor layer 22$aa$, and the first gate conductor layer 21$aa$ are connected to two-stage dynamic flash memory cells that are adjacently disposed in the direction of line X-X' and in the direction of line Y-Y' as viewed in plan view. In contrast, FIGS. 2A to 2C illustrate an instance in which, as viewed in plan view, the fourth gate conductor layer 21$ba$, the third gate conductor layer 22$ba$, the silicide layer 18$a$, the second gate conductor layer 22$aa$, and the first gate conductor layer 21$aa$ extend in the direction of line X-X' and are shared by an adjacent two-stage dynamic flash memory cell. In this instance, the fourth gate conductor layer 21$ba$, the third gate conductor layer 22$ba$, the silicide layer 18$a$, the second gate conductor layer 22$aa$, and the first gate conductor layer 21$aa$ are isolated from a two-stage dynamic flash memory cell that is adjacently disposed in the direction of line Y-Y'.

In this instance, etching is performed in the same manner as in the instance of FIGS. 1AA to 1KC, with a single etching mask, to form a sixth insulating layer 7$ea$, a fourth gate conductor layer 21$ba$, a fifth insulating layer 7$da$, a third gate conductor layer 22$ba$, a fourth insulating layer 7$ca$, a silicide layer 18$a$, a third insulating layer 7$ba$, a second gate conductor layer 22$aa$, a second insulating layer 7$aa$, and a first gate conductor layer 21$aa$, such that these layers have the same shape as viewed in plan view. Consequently, the same characteristics as in the instance of FIGS. 1AA to 1KC can be obtained.

Figures 2A, 2B, 2C:
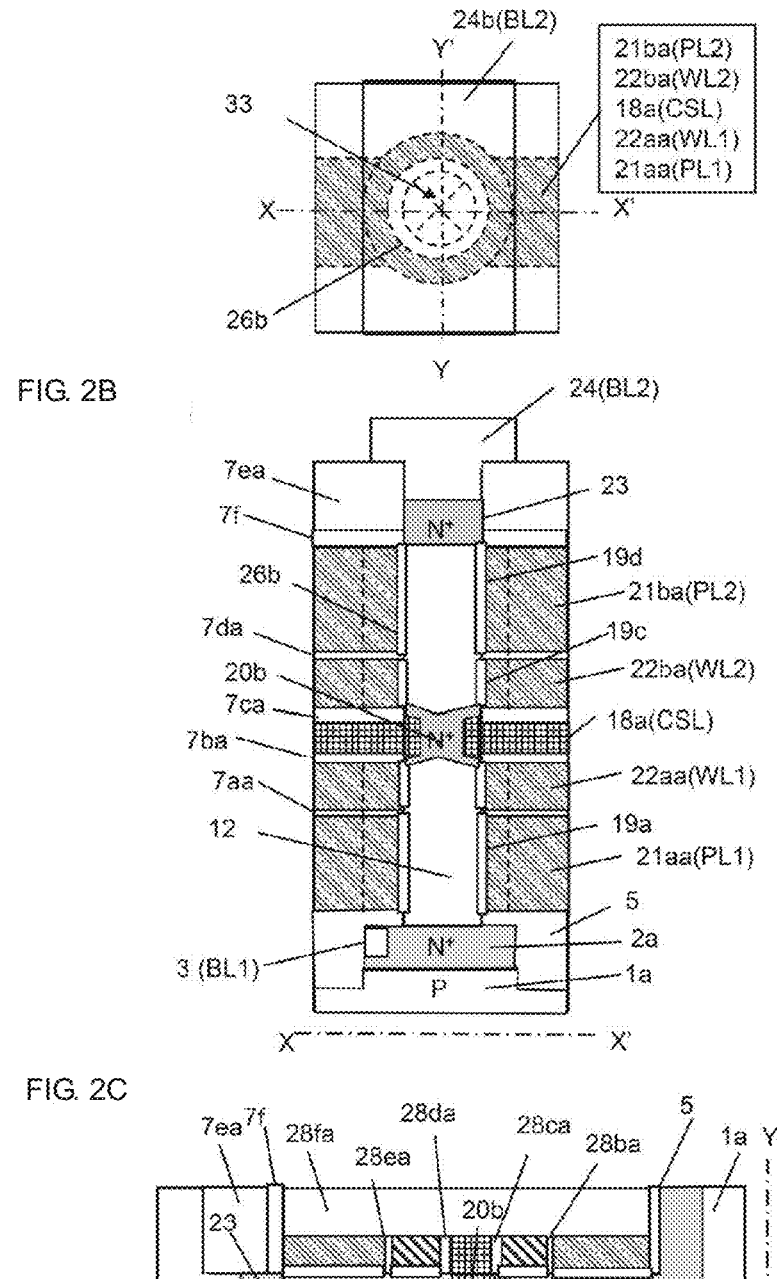
FIGS. 2A, 2B, and 2C are diagrams used to illustrate a method for manufacturing a two-stage dynamic flash memory cell according to another embodiment.

Referring to FIGS. 2B and 2C, an insulating layer 7$f$ may be provided between the fourth gate conductor layer 21$ba$ and the sixth insulating layer 7$ea$. In this case, the formation of an N$^+$ layer 23 can be performed as follows: the sixth insulating layer 7$ea$ is removed to expose a top portion of the Si pillar 12, and thereafter, a selective epitaxial crystal growth method, for example, is performed to form an N$^+$ layer that covers the top portion of the Si pillar 12. In this instance, the N$^+$ layer 23 may also be formed on the top portion of the Si pillar 12 by using an ion implantation method or by thermal diffusion caused by, for example, a flash annealing method.

Figure 3A:
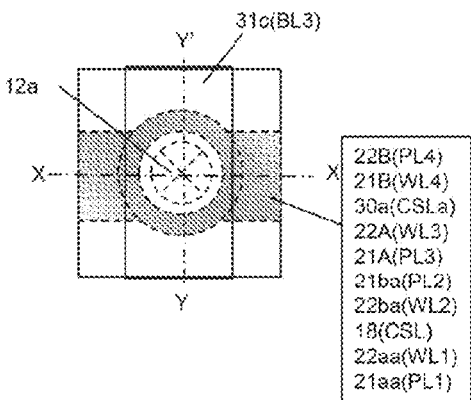
FIGS. 3A and 3B are diagrams used to illustrate a method for manufacturing a four-stage dynamic flash memory cell according to another embodiment.
Figure 3B:
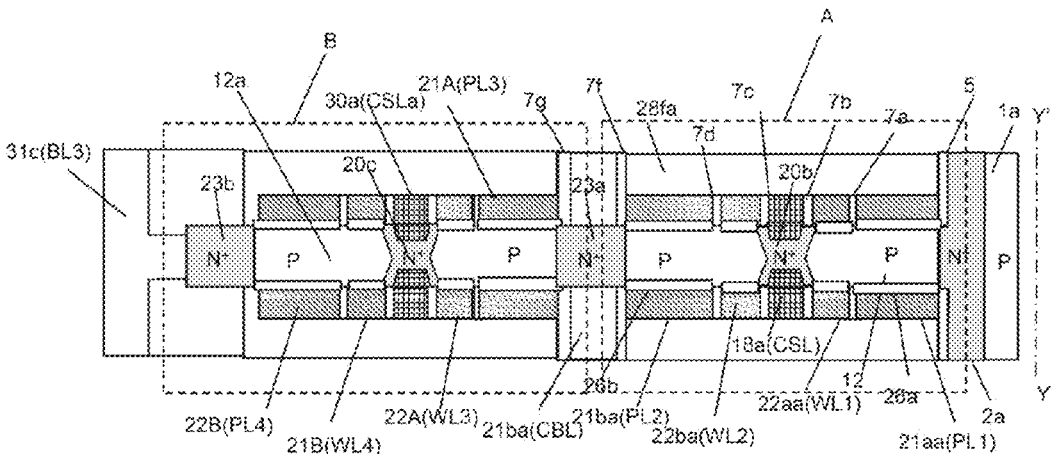
Figure 4:
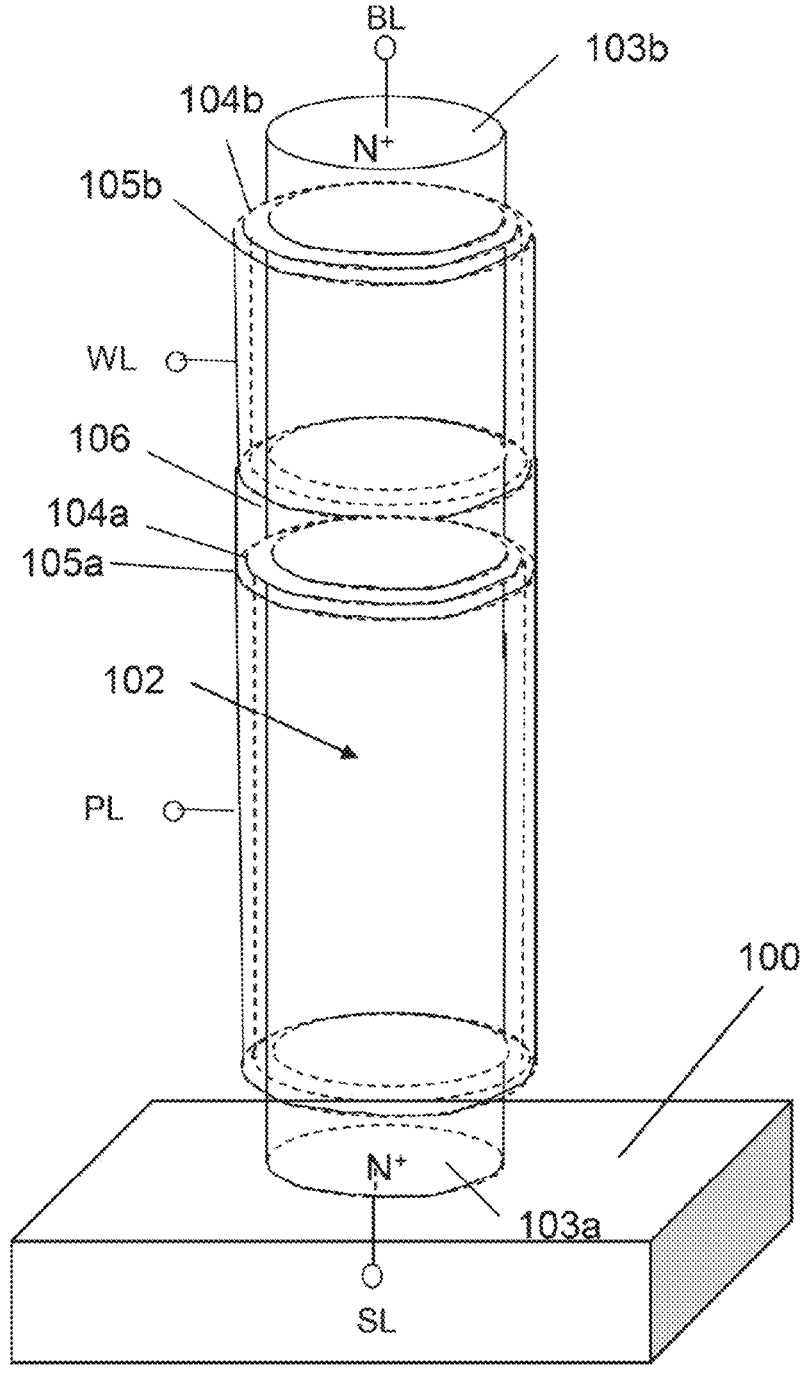
FIG. 4 is a diagram illustrating a single-stage dynamic flash memory cell of the related art.

A method for manufacturing a four-stage dynamic flash memory cell according to another embodiment of the present invention will be described with reference to FIGS. 3A and 3B. Regarding the designation of each of the figures, "A" at the end of the designation denotes a plan view of the four-stage dynamic flash memory cell, and "B" at the end of the designation denotes a cross-sectional view taken along line X-X' of the figure of "A". Actual dynamic flash memories include a two-dimensional array of a large number of the four-stage dynamic flash memory cells.

A two-stage dynamic flash memory cell A is formed on a P layer substrate 1$a$ with the manufacturing method that was first illustrated with reference to FIGS. 1AA to 1KC. Subsequently, a two-stage dynamic flash memory cell B is formed with a process that is substantially the same as that for the two-stage dynamic flash memory cell A. Thus, two two-stage dynamic flash memory cells A and B are formed, with an N$^+$ layer 23$a$ connected to a metal wiring layer 21$ba$ being used as a common N$^+$ layer. The metal wiring layer 21$ba$ is disposed between the insulating layers 7$f$ and 7$g$ and connected to a common bit line CBL. The metal wiring layer 21$ba$ extends in the direction of line Y-Y' as viewed in plan view. In the two-stage dynamic flash memory cell B, a fifth gate conductor layer 21A, a sixth gate conductor layer 22A, a seventh gate conductor layer 21B, and an eighth gate conductor layer 22B are formed to substantially have the same shape as and overlap with the first to fourth gate conductor layers 21$aa$, 22$aa$, 22$ba$, and 21$ba$ of the two-stage dynamic flash memory cell A, as viewed in plan view. The fifth gate conductor layer 21A is a layer to be connected to a third plate line PL3, the sixth gate conductor layer 22A is a layer to be connected to a third word line WL3, the seventh gate conductor layer 21B is a layer to be connected to a fourth word line WL4, and the eighth gate conductor layer 22B is a layer to be connected to a fourth plate line PL4.

Note that an N$^+$ layer 20$b$ and an N$^+$ layer 20$c$ of the two two-stage dynamic flash memory cells A and B have different thermal history periods that elapse until the final step; accordingly, the length of each of the periods or the process conditions for forming silicide layers 18$a$ and 30$a$ are to be adjusted in consideration of the final form.

The present embodiment has the following features.

(1) This manufacturing method enables the first to eighth gate conductor layers 21$aa$, 22$aa$, 22$ba$, 21$ba$, 21A, 22A, 21B, and 22B, which are stacked in the vertical direction in the four-stage dynamic flash memory cell, to be formed to have substantially the same shape as viewed in plan view. Consequently, high integration density of the dynamic flash memory is achieved.

(2) The manufacturing method presented herein is also applicable to the formation of a dynamic flash memory cell having six, eight, or more stages. Consequently, high integration density of a dynamic flash memory is realized.

OTHER EMBODIMENTS

Note that the P layer substrates 1 and 1$a$, illustrated in FIGS. 1AA to 1KC, may be, for example, an SOI (silicon oxide insulator) substrate or a well structure substrate, provided that these substrates can perform the function of the substrate. The same applies to the other embodiments.

In FIGS. 1AA to 1KC, the Si pillar 12 is illustrated as having a circular plan-view shape. Alternatively, the Si pillar 12 may have a different plan-view shape, such as a rectangular shape or an ellipsoidal shape. The same applies to the other embodiments.

Furthermore, referring to FIGS. 1AA to 1KC, the sixth insulating layer 7$e$, the fourth conductor layer 21$b$, the fifth insulating layer 7$d$, the third conductor layer 22$b$, the fourth insulating layer 7$c$, the silicide layer 18, the third insulating layer 7$b$, the second conductor layer 22$a$, the second insulating layer 7$a$, and the first conductor layer 21$a$, which are disposed in this order, starting from an upper position, are etched with a single etching mask such that these layers have the same shape as viewed in plan view, and as a result, as illustrated in FIGS. 1KB and 1KC, the following layers are formed: the sixth insulating layer 7$ea$, the fourth gate conductor layer 21$ba$, the fifth insulating layer 7$da$, the third gate conductor layer 22$ba$, the fourth insulating layer 7$ca$, the silicide layer 18$a$, the third insulating layer 7$ba$, the second gate conductor layer 22$aa$, the second insulating layer 7$aa$, and the first gate conductor layer 21$aa$. In this instance, although variations in the plan-view shape may occur, for example, due to variations in a side etching length of the layers that occur in the case of simultaneous etching, the layers substantially have the same plan-view shape. The same applies to the other embodiments.

In the present invention, various embodiments and modifications are possible without departing from the broad spirit and scope of the present invention. The above-described embodiments are illustrative examples of the present invention and do not limit the scope of the present invention. The above-described embodiments and modifications can be freely combined with each other. Furthermore, some of the features of the above-described embodiments may be omitted as necessary, and even in such cases, the embodiments are still within the technical spirit of the present invention.

The method of the present invention for manufacturing a semiconductor-element-containing memory device enables the manufacture of a high-density and high-performance memory device.

What is claimed is:

1. A method for manufacturing a semiconductor-element-containing memory device that includes a first memory cell configured to perform a data write operation, a data read operation, and a data erase operation by using a voltage that is applied to a first wiring layer, a second wiring layer, and a third wiring layer, the first wiring layer being connected to a first impurity layer, the second wiring layer being connected to a first gate conductor layer, a second gate conductor layer, and a second impurity layer, the third wiring layer being connected to a third gate conductor layer, a fourth gate conductor layer, and a third impurity layer, the method comprising the steps of:

forming the first impurity layer over a substrate and forming, over the first impurity layer, in a layered manner, a first insulating layer, a first material layer, a second insulating layer, a second material layer, a third insulating layer, a third material layer, a fourth insulating layer, a fourth material layer, a fifth insulating layer, a fifth material layer, and a sixth insulating layer, which are disposed in this order, starting from a lower position;

forming a first hole extending through the first to sixth insulating layers and the first to fifth material layers in a vertical direction and having a bottom portion in the first impurity layer;

filling the first hole with a first pillar-shaped semiconductor layer;

removing the third material layer to form a first space;

forming a first semiconductor layer in contact with an inner wall of the first space with a portion of the first space being left unfilled, the first semiconductor layer containing a donor impurity or an acceptor impurity;

forming a first alloy layer that is made of an alloy or a metal and fills the portion of the first space that is inside the first semiconductor layer:

performing a heat treatment, thereby causing the first semiconductor layer and the first alloy layer to be integrated with each other to form a second alloy layer and also causing the donor impurity or the acceptor impurity of the first semiconductor layer to diffuse into the first pillar-shaped semiconductor layer to form the second impurity layer;

removing the first material layer, the second material layer, the fourth material layer, and the fifth material layer to form a second space and forming a first gate insulating layer that covers at least an exposed portion of a side surface of the first pillar-shaped semiconductor layer in the second space;

forming a first conductor layer, a second conductor layer, a third conductor layer, and fourth conductor layer, which are disposed in this order, starting from a lower position, and fill the second space;

etching, with a single mask, the second alloy layer, the first to fourth conductor layers, and the second to sixth insulating layers to form the first to fourth gate conductor layers and the second wiring layer such that the first to fourth gate conductor layers and the second wiring layer have substantially a same shape as viewed in plan view;

forming the third impurity layer on a top portion of the first pillar-shaped semiconductor layer; and forming the third wiring layer that is connected to the third impurity layer, the third wiring layer extending in a same direction as the first wiring layer and being perpendicular to the second wiring layer, as viewed in plan view.

2. The method for manufacturing a semiconductor-element-containing memory device according to claim 1, further comprising the step of connecting the first wiring layer to a first bit line, connecting the second wiring layer to a common source line, and connecting the third wiring layer to a second bit line.

3. The method for manufacturing a semiconductor-element-containing memory device according to claim 1, further comprising the steps of:

connecting one of the first gate conductor layer and the second gate conductor layer to a first plate line and connecting another of the first gate conductor layer and the second gate conductor layer to a first word line;

connecting the third gate conductor layer to one of a second plate line and a second word line that has a same driving purpose as the second gate conductor layer; and connecting the fourth gate conductor layer to one of the second plate line and the second word line that has a same driving purpose as the first gate conductor layer.

4. The method for manufacturing a semiconductor-element-containing memory device according to claim 1, wherein the forming of the first to fourth conductor layers that fill the second space is performed before the forming of the second alloy layer.

5. The method for manufacturing a semiconductor-element-containing memory device according to claim 1, wherein the forming of the first to fourth conductor layers that fill the second space is performed after the forming of the second alloy layer.

6. The method for manufacturing a semiconductor-element-containing memory device according to claim 1, wherein the first semiconductor layer comprises a donor impurity or an acceptor impurity and comprises at least silicon atoms.

7. The method for manufacturing a semiconductor-element-containing memory device according to claim 1, wherein the first alloy layer comprises at least nickel atoms.

8. The method for manufacturing a semiconductor-element-containing memory device according to claim 1, wherein the first and fourth gate conductor layers and one or both of the second and third gate conductor layers are formed to each comprise a plurality of layers disposed in the vertical direction.

9. The method for manufacturing a semiconductor-element-containing memory device according to claim 1, wherein the first to fourth gate conductor layers and the second wiring layer are formed to each comprise two layers having a same shape as viewed in plan view.

10. The method for manufacturing a semiconductor-element-containing memory device according to claim 1, wherein the first to fourth gate conductor layers are formed to have a same height in the vertical direction.

11. The method for manufacturing a semiconductor-element-containing memory device according to claim 1, further comprising forming a second memory cell over the first pillar-shaped semiconductor layer with a process that is substantially a same as the process for the first memory cell and by using the third impurity layer as a common impurity layer, the second memory cell having a structure in which upper and lower positions are reversed in the vertical direction compared to the upper and lower positions of the first memory cell, the method comprising the steps of:

forming the third wiring layer such that the third wiring layer is connected to a side surface of the third impurity layer and extends in a direction perpendicular to the second conductor layer as viewed in plan view;

forming a second pillar-shaped semiconductor layer over the third impurity layer;

forming a fifth gate conductor layer, a sixth gate conductor layer, a fourth wiring layer, a seventh gate conductor layer, and an eighth gate conductor layer, which are disposed in this order, starting from a lower position, and are isolated from one another, the fourth wiring layer being connected to a fourth impurity layer formed in the second pillar-shaped semiconductor layer;

forming a second gate insulating layer that is disposed between the second pillar-shaped semiconductor layer and the fifth to eighth gate conductor layers;

forming a fifth impurity layer on a top portion of the second pillar-shaped semiconductor layer; and forming a fifth wiring layer that is connected to the fifth impurity layer and extends in a same direction as the third wiring layer, as viewed in plan view, wherein the fifth to eighth gate conductor layers and the fourth wiring layer are formed to substantially have a same shape as and overlap with the first to fourth gate conductor layers and the second wiring layer, as viewed in plan view.

12. The method for manufacturing a semiconductor-element-containing memory device according to claim 11, further comprising the steps of:

connecting the third wiring layer to a common bit line of the first and second memory cells;

connecting one of the fifth gate conductor layer and the sixth gate conductor layer to a third plate line and connecting another of the fifth gate conductor layer and the sixth gate conductor layer to a third word line;

connecting the seventh gate conductor layer to one of a fourth plate line and a fourth word line that has a same driving purpose as the sixth gate conductor layer; and connecting the eighth gate conductor layer to one of the fourth plate line and the fourth word line that has a same driving purpose as the fifth gate conductor layer.

13. The method for manufacturing a semiconductor-element-containing memory device according to claim 1, wherein the first wiring layer is formed to surround a portion or an entirety of an outer peripheral portion of a bottom portion of the first pillar-shaped semiconductor layer, as viewed in plan view, and to be connected to the first impurity layer.

14. The method for manufacturing a semiconductor-element-containing memory device according to claim 1, wherein the first to fourth gate conductor layers and the second wiring layer have a same shape and extend two-dimensionally, as viewed in plan view, and are connected to adjacent memory cells.

15. The method for manufacturing a semiconductor-element-containing memory device according to claim 1, wherein the first and fourth gate conductor layers are formed to each comprise a plurality of gate electrode conductor layers that constitute a first drain-side select gate conductor layer, a plurality of first word line gate conductor layers, a first source-side select gate conductor layer, a second source-side select gate conductor layer, a plurality of second word line gate conductor layers, and a second drain-side select gate conductor layer, which are disposed in this order, starting from a lower position, the first pillar-shaped semiconductor layer is formed to include or not to include an insulating layer in a middle portion, and the first insulating layer is formed to include a floating conductor layer or a charge trap layer, the first insulating layer surrounding the first pillar-shaped semiconductor layer and the first and second word line gate conductor layers, the floating conductor layer being electrically isolated from the first pillar-shaped semiconductor layer and the first and second word line gate conductor layers, the charge trap layer being made of an insulating layer.

16. The method for manufacturing a semiconductor-element-containing memory device according to claim 15, wherein the first drain-side select gate conductor layer and the second drain-side select gate conductor layer each comprise a plurality of gate conductor layers.

* * * * *